United States Patent [19]
Yonehara et al.

[11] Patent Number: 5,219,769
[45] Date of Patent: Jun. 15, 1993

[54] METHOD FOR FORMING SCHOTTKY DIODE

[75] Inventors: Takao Yonehara, Atsugi; Hiroshi Kawarada; Jing S. Ma, both of Minoo; Akio Hiraki, Takarazuka, all of Japan

[73] Assignee: Canon Kabushiki Kaisha, Tokyo, Japan

[21] Appl. No.: 617,157

[22] Filed: Nov. 23, 1990

[30] Foreign Application Priority Data

Mar. 27, 1990 [JP] Japan ................. 2-080012

[51] Int. Cl.⁵ ........................... H01L 21/265
[52] U.S. Cl. ........................ 437/35; 437/39; 156/DIG. 68
[58] Field of Search .......... 357/15; 437/35, 39; 156/DIG. 68, 612, 613, 614; 423/446; 204/112.15

[56] References Cited

U.S. PATENT DOCUMENTS

| | | | |
|---|---|---|---|
| 4,836,881 | 6/1989 | Satoh et al. | 156/DIG. 68 |
| 4,863,529 | 9/1989 | Imai et al. | 437/103 |
| 4,927,619 | 5/1990 | Tsuji | 423/446 |
| 4,982,443 | 1/1991 | Nakahata et al. | 357/15 |
| 5,010,033 | 4/1991 | Tokunaga et al. | 437/90 |

FOREIGN PATENT DOCUMENTS

| | | | |
|---|---|---|---|
| 1261298 | 4/1988 | Japan | 423/446 |
| 2184598 | 1/1989 | Japan | 156/DIG. 68 |
| 3166798 | 7/1988 | United Kingdom | 156/DIG. 68 |
| 2030697 | 2/1990 | United Kingdom | 156/DIG. 68 |

OTHER PUBLICATIONS

*Materials Research Society Publication*, 1989 Fall Meeting, Nov. 27–Dec. 2, 1989, H. Karawada et al., "Selective Nucleation Based Epitaxy of CVD Diamond and Its Applicability to Semiconducting Device".

Matsumoto et al. "Vapor Deposition of Diamond Particles from Methane," *Jap. Journal of Applied Physics*, pp. L183–L185.

*Primary Examiner*—Olik Chaudhuri
*Assistant Examiner*—Loc Q. Trinh
*Attorney, Agent, or Firm*—Fitzpatrick, Cella, Harper & Scinto

[57] ABSTRACT

A method for forming a diode provided with electrodes and a semiconductive layer. Such method comprises applying ion beam irradiation to a substrate having a protruding portion at a desired position for monocrystalline diamond formation. In this manner the substrate is and subjected to surface modification thereby effecting a process for diamond crystal growth on the substrate.

14 Claims, 3 Drawing Sheets

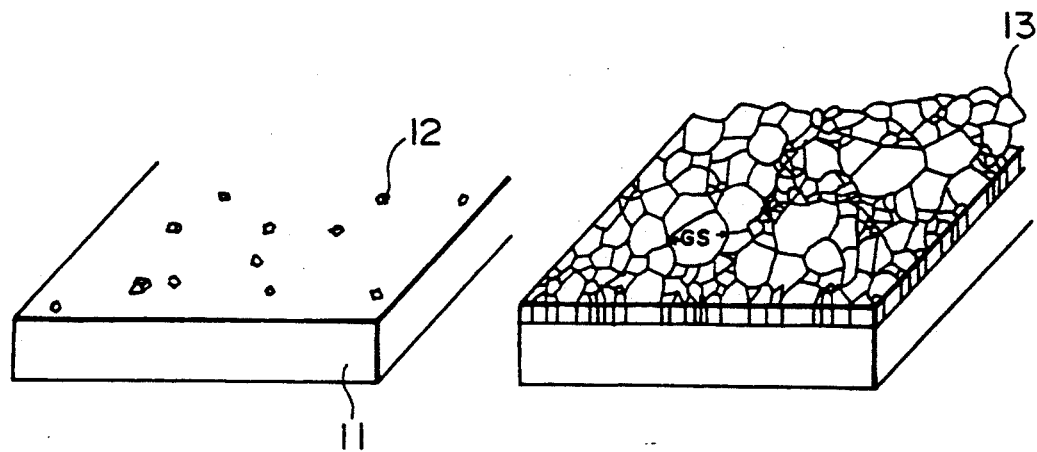
F I G. 1A  F I G. 1B
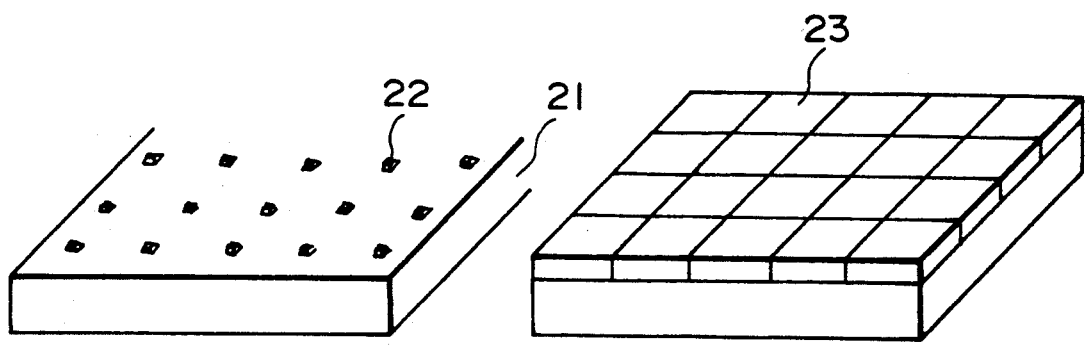
F I G. 2A  F I G. 2B

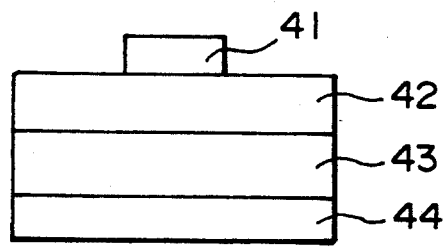
F I G. 4
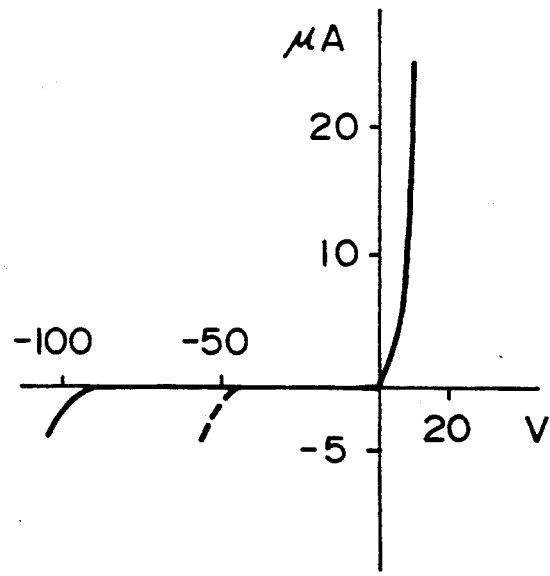
F I G. 5

METHOD FOR FORMING SCHOTTKY DIODE

BACKGROUND OF THE INVENTION

1. Field of the Invention

The present invention relates to a Schottky diode utilizing diamond as a semiconductive material.

2. Related Background Art

Diamond is known as a unique semiconductor. It is suitable for use in electronic devices operating at high speed, high power or under harsh climatic conditions. For example, diamond exhibits electron and positive hole mobility of 2,000 and 2,100 respectively, which are sufficiently high in comparison with those of Si (1,500; 450), GaAs (8,500; 400) or 3C-SiC (1,000; 70). Also, the thermal conductivity and the energy band gap of diamond are significantly larger than those of other semiconductive materials. Tab. 1 shows the comparison of these properties, extracted from N. Fujimori, "Handbook of Synthetic Diamond" and Setaka et al;., Science Forum, Tokyo, 1989.

TABLE 1

|  | Si | GaAs | 3C-SiC | Diamond |
|---|---|---|---|---|
| Energy gap[eV] | 1.1 | 1.4 | 2.2 | 5.5 |
| Thermal conductivity [W/cmK] | 1.5 | 0.5 | 4.9 | 20.0 |
| Electron mobility | 1500 | 8500 | 1000 | 2000 |
| Positive hole mobility [$cm^2$/V.sec] | 450 | 400 | 70 | 2100 |

However, these excellent properties can only be exhibited in a monocrystalline layer, and can hardly be reflected in electronic devices in case of an amorphous or polycrystalline structure involving many imperfections. Up to the present, diamond in monocrystalline structure could only be obtained as a natural product, by synthesis under high temperature and high pressure, or by homoepitaxial growth of thin monocrystalline layer on such natural or synthesized diamond. Consequently diamond is unfavorable in terms of productivity, economy and limitation in space as a substrate in comparison with other semiconductive materials.

On the other hand, deposition of diamond on Si or $SiO_2$ does not provide a monocrystalline layer but a polycrystalline layer in which minute monocrystalline domains are mutually separated by domain boundaries as reported by B. V. Derjaguin et al., J. Crystal Growth 2 (1986) 380; S. Matsumoto et al., Jpn. J. Appl. Phys. 21 (1982) L183; and H. Kawarada et al., Jpn. J. Appl. Phys. 26 (1987) L1031.

A device formed on such polycrystalline layer cannot exhibit sufficient device characteristics due to a potential barrier against carrier movement, formed by the domain boundary.

SUMMARY OF THE INVENTION

The object of the present invention is to provide a method for forming a Schottky diode with improved device characteristics in a manner which artificially avoids the undesirable influence of grain boundaries on a substrate with reduced limitation on productivity, economy and area.

The above-mentioned object can be attained, according to the present invention, by a method for forming a diode with an electrode and a semiconductive layer, characterized by applying ion irradiation to a substrate having a projecting portion in a desired position for monocrystalline diamond growth and subjected to surface modification, and effecting diamond crystal growth.

BRIEF DESCRIPTION OF THE DRAWINGS

FIGS. 1A and 1B are schematic views showing a polycrystalline layer with nucleations at random positions;

FIGS. 2A and 2B are schematic views showing a polycrystalline layer formed by crystal growth control positions of nucleation;

FIG. 4 is a schematic view of a Schottky diode formed on a diamond layer; and

FIG. 5 is a chart showing the current-voltage characteristic of a Schottky diode formed on a diamond layer.

DETAILED DESCRIPTION OF THE PREFERRED EMBODIMENTS

Figure 3A:
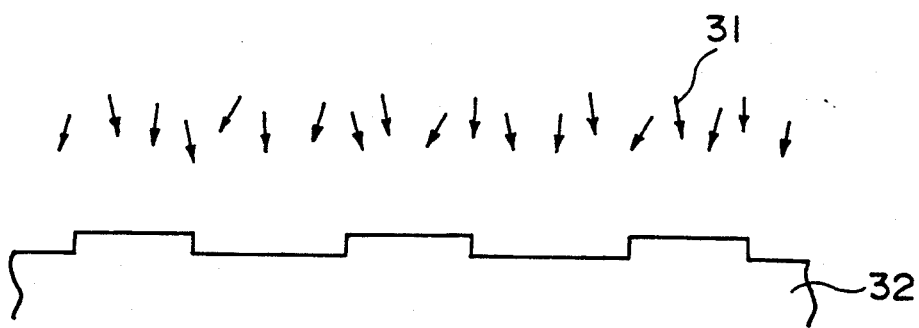
FIGS. 3A to 3D are schematic view showing the process for selective growth of diamond crystals.

The object of the present invention can be attained by a method having the features described in the appended claims. More specifically, the present invention allows to obtain a Schottky diode with reduced fluctuation in performance and improved device characteristics particularly with excellent inverse voltage resistance. This is accomplished by growing a diamond layer on a silicon substrate in such a manner that the active area of the device is excluded from grain boundaries. Thereby reducing limitation on productivity, economy and area.

In general, the crystalline structure of a deposited layer is determined by and follows that of a substrate if an epitaxial relationship stands between both crystalline structures. For example, a monocrystalline silicon layer can be grown on a monocrystalline silicon substrate. Also a monocrystalline GaAs layer can be grown on a monocrystalline GaAs substrate. Such relationship generally stands when the lattice constant of the deposited layer is the same as that of the substrate, or when the chemical properties of the deposited layer are close to those of the substrate. The incoming atoms of the deposited layer diffuse on the surface of the substrate, then preferentially remain on kinks or steps on the substrate surface, and grow into a layer, forming a terrace. On the other hand, when GaAs is deposited on a monocrystalline Si substrate, a monocrystalline GaAs layer can be formed under suitable depositing conditions, even though the lattice constants of both layers are significantly different. In this case, however, because of elevated interfacial energy resulting from the difference in chemical properties, the growth does not take place in a layer but follows a process of three-dimensional nucleation effecting growth and amalgamation of such grown nuclei into a continuous layer. In said amalgamation, no grain boundaries are formed because the directions of crystallization of the nuclei are three dimensionally defined by that of the monocrystalline substrate. Consequently the electronic device formed on thus obtained monocrystalline semiconductor layer can function reflecting the excellent properties of said semiconductor layer.

On the other hand, if the epitaxial relationship does not stand between two layers, as in the case of diamond and silicon, three-dimensional nuclei with disorderly directions of crystallization are formed in arbitrary positions on the substrate as shown in FIG. 1A, and grow individually. As a result, mutually neighboring nuclei collide with each other to form a boundary of uncontrolled position at the interface, so that a polycrystalline structure is eventually obtained as a whole, as shown in FIG. 1B. Although a monocrystalline structure is present within a domain surrounded by grain boundaries, the area of such monocrystalline domain is inevitably random because of the random position of the grain boundary resulting from the random nucleation positions. The electronic device formed on such random polycrystalline layer is unable to reflect the excellent properties of the material of said layer. In fact the characteristics of such device are predominantly determined by the height and quantity of potential barries of the grain boundaries, and are therefore fluctuating and insufficient.

However the present inventors have found that in a system without epitaxial relationship, the positions of nucleation can be controlled by a structure shown in FIGS. 2A and 2B. It is therefore rendered possible to grow a monocrystalline area of a size enough for device formation, in an arbitrary position. It is also possible to prevent the formation of boundaries, by terminating the growth of monocrystalline islands prior to the collisions thereof. Furthermore, even after the collision of the growing monocrystalline islands, the area for forming the device can be made free from the grain boundaries because such boundaries can be formed in desired positions. It is therefore rendered possible to form the devices without the grain boundaries or with predetermined quantity and position of the grain boundaries, and to obtain device characteristics without fluctuation and reflecting the properties of the material, as in the case of device formed on a monocrystalline layer.

Schottky diodes prepared in this manner are naturally much more uniform, in performance than those formed on a random polycrystalline layer.

Figure 3B:
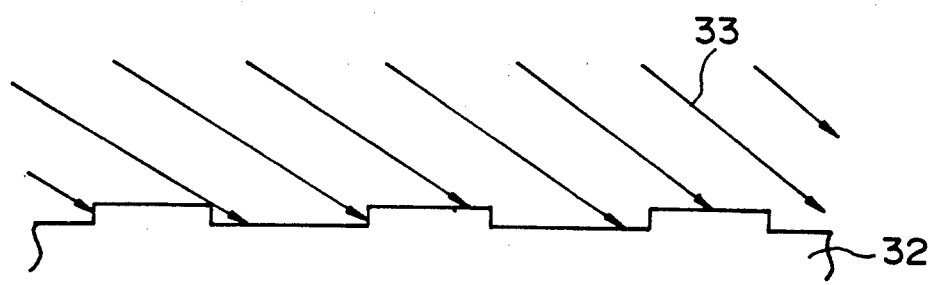
Figure 3C:
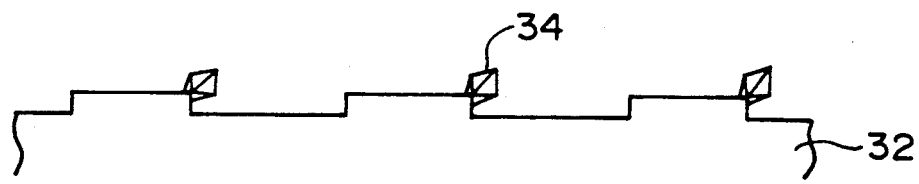
Figure 3D:
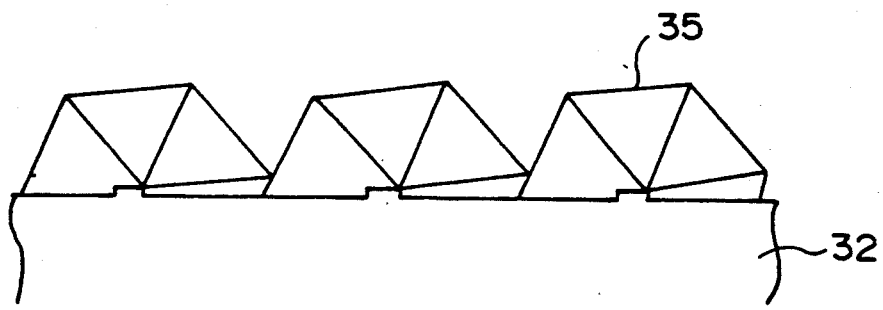

Now reference is made to FIGS. 3A to 3D for explaining an embodiment of the present invention. At first, surface irregularities are formed on the surface of a silicon substrate 32. Then said substrate 32 is immersed in liquid containing fine diamond particles 31 and is subjected to vibration, for example by ultrasonic wave to modify the surface of said silicon substrate 32. In this step the substrate surface is given a stress energy, minute coarseness or deposition of small diamond crystals, for increasing the nucleation density of gaseous grown diamond. Diamond nucleation scarcely takes place on the silicon substrate 32 without the above-mentioned step of surface modification. If diamond is deposited in the state shown in FIG. 3A, a polycrystalline diamond layer is formed over the entire surface of the substrate 32 without any selectivity. For the purpose of forming a single diamond nucleus selectively in a desired position, the present inventors have found a method of diagonal ion beam irradiation with an incident angle $\theta$, as shown in FIG. 3B. The modified surface layer, formed by diamond particles as explained above, is removed by the ion beam irradiation, but said surface layer, essential for the nucleation, remains in the farthest position, with respect to the direction of ion beam irradiation, among four corners of the protruding portion formed on the substrate surface. Thus the single nucleus of diamond is formed only in this position by a diamond forming process as shown in FIG. 3C. The modification of silicon surface by diamond particles takes place most strongly at the corners of the protruding portion, so that the sites for diamond nucleation are formed more densely in said corners. The diagonal ion beam irradiation has least effect of removal of said nucleation sites in the farthest corner in the direction of irradiation, so that the sites can be selectively left in said corner. The diamond nucleus grows by the continuation of the above-mentioned diamond forming process, and eventually contacts the neighboring diamond crystals. FIG. 4 shows the structure of Schottky diodes formed on diamond crystals having sufficiently large monocrystalline areas selectively grown in predetermined positions as explained above. The Schottky diode was prepared by forming the above-explained diamond layer 42 on a P+ Si substrate 43, then forming an ohmic electrode 44 on the bottom face of said substrate and forming an aluminum electrode 41 on the top face of said diamond layer.

For the purpose of comparison, a Schottky diode was prepared in a similar manner on a polycrystalline diamond layer with random nucleation. FIG. 5 shows the measured voltage-current characteristics, in which a solid line indicates the performance of the device formed on the diamond crystal with controlled nucleation position, while a broken line indicates that of the device formed on the diamond layer with random nucleation position.

Though the performance in the forward direction is almost the same for both devices, the breakdown voltage in the reverse direction in the device formed on the selectively grown crystal is about twice as large as that of the device formed on the randomly grown crystals. Stated differently, the inverse breakdown voltage of the Schottky diode increases drastically when it is formed on the diamond crystal which lacks the grain boundary functioning as a path for leakage current.

In order to remove the modified surface layer of the substrate while leaving enough area of said layer for the formation of single diamond nuclei, the incident angle of the ion beam irradiation is preferably within a range from 5° to 90°, more preferably from 10° to 80°, and most preferably from 20° to 70°.

Examples of irradiating ions include argon, silicon, germanium, phosphor and boron.

The acceleration energy of the irradiating ions is preferably within a range from 1 to 10 keV, more preferably from 2 to 8 keV, and most preferably from 3 to 7 keV.

Examples of the substrate include a monocrystalline silicon substrate (orientation of crystal (100), (110), (111) etc.), a polycrystalline silicon substrate, and a glass substrate principally composed of $SiO_2$.

Also the depth of surface irregularities formed on said substrate is preferably within a range from 0.1 to 1 $\mu$m, more preferably from 0.2 to 0.8 $\mu$m, and most preferably from 0.12 to 0.5 $\mu$m, in view of formation of a modified surface layer suitable for obtaining single diamond nuclei in desired positions on the substrate.

Though the protruding portions of the substrate have been assumed to be rectangular in the foregoing description, said protruding portions are not limited to such shape.

The atmospheric pressure at the aforementioned ion beam irradiation onto the substrate is preferably within a range from $10^{-6}$ to $10^{-2}$ Torr. Below the lower limit mentioned above, the ion current becomes insufficient and the selectivity for diamond deposition becomes deficient. On the other hand, above the upper limit, the ion current becomes excessively large and the selectivity again becomes deficient. The former deficiency results from excessively high diamond nucleation density, while the latter results from excessively low diamond nucleation density.

Also the area of each protruding portion formed on the substrate is desirably so small as to allow formation of a single crystal per each protruding portion, and is preferably not exceeding 16 $\mu m^2$, and more preferably not exceeding 4 $\mu m^2$.

EXAMPLE

On the surface of a P-type silicon monocrystalline (100) substrate, there were formed, by reactive ion etching, rectangular protruding portions of a size of $2\times 2$ $m^2$ and a height of 0.2 $\mu m$, mutually spaced by 10, 20, 30 or 40 $\mu m$. The specific resistivity of the substrate was $10^{-2}$ $\Omega cm$. The substrate was then immersed in aqueous dispersion of diamond particles of Ca. 30 $\mu m$ in diameter, and was subjected to ultrasonic vibration for 3 minutes (cf. FIG. 3A). After drying, the substrate was subjected to irradiation with argon ion beam with an incident angle $\theta = 30°$ (cf. FIG. 3B). The atmospheric pressure during said irradiation was ca. $10^{-4}$ Torr. The ion beam current and acceleration voltage were respectively 50 $\mu A$ and 5 kV, and the irradiation time was 12 minutes.

Subsequently diamond was grown on said substrate by a CVD process utilizing microwave plasma (cf. FIG. 3C) under following conditions:

| | |
|---|---|
| substrate temperature | 150° C. |
| pressure | 35 Torr |
| microwave power | 310 W |
| gas | CO (5%)/$H_2$ |
| growth time | 15 hours |

The above-mentioned growth provided single crystals of diamond, each about 10 $\mu m$ in diameter, uniformly arrange with a pitch of 10, 20, 30 or 40 $\mu m$. The thickness of said crystals was about 5 $\mu m$. For the purpose of comparison, diamond deposition conducted under the same conditions on a substrate which has been subjected to surface modification with diamond particles without formation of protruding portions and without ion beam irradiation provided a polycrystalline diamond layer with widely varying grain sizes from 1 to 5 $\mu m$, as shown in FIG. 1B.

Though the raw material was not doped with impurities, boron present at a high concentration in the substrate was diffused into the diamond in the course of growth thereof.

Schottky diode was prepared in the following manner. Aluminum electrodes 41, 44, of a thickness of 0.5 $\mu m$, were formed by electron beam evaporation respectively on the bottom face of the Si substrate 43 and on the top face of the diamond layer 42. The aluminum functions as an ohmic electrode 44 for the silicon of low resistance, and as a Schottky electrode 41 for the diamond layer. As shown in FIG. 5, the inverse breakdown voltage of the diode formed on monocrystalline diamond was about twice as large as that of the diode formed on polycrystalline diamond.

As explained in the foregoing, the Schottky diode formed on a sufficiently large selectively deposited monocrystalline diamond crystal having a sufficiently large monocrystalline grown in a predetermined position according to the present invention is superior, particularly in the inverse breakdown voltage, to the Schottky diode formed on a polycrystalline diamond layer with random nucleations.

What is claimed is:

1. A method for forming a Schottky diode, comprising the steps of:
    subjecting a substrate having a protruding portion at a desired position to surface modification;
    applying oblique ion beam irradiation to the substrate for removing a part of a modified surface portion of the substrate;
    effecting a process for diamond crystal growth on the substrate in the vicinity of the modified surface which remains on the substrate, so as to form a crystalline diamond body; and
    forming a Schottky electrode in contact with the crystalline diamond body.

2. A method according to claim 1, wherein the height of the protruding portion is between 0.1 and 1 $\mu m$.

3. A method according to claim 1, wherein said oblique ion beam irradiation is conducted having an incident angle between 5° and 90°.

4. A method according to claim 1, wherein said surface modification is conducted by applying an ultrasonic wave to the substrate while the substrate is immersed in a liquid dispersion of fine diamond particles.

5. A method according to claim 1, wherein said diamond crystal growing process is conducted by chemical vapor deposition.

6. A method for forming a Schottky diode, comprising the steps of;
    subjecting a substrate having a protruding portion at a desired position to ultrasonic treatment;
    applying oblique ion beam irradiation to the substrate for removing a part of the subjected substrate surface of the substrate;
    effecting a diamond crystal growing process on the substrate in the vicinity of the subjected surface which remains on the substrate, so as to form a crystalline diamond body; and
    forming a Schottky electrode in contact with the crystalline diamond body.

7. A method according to claim 6, where the height of the protruding portion is between 0.1 and 1 $\mu m$.

8. A method according to claim 6, wherein said oblique ion beam irradiation is conducted having an incident angle between 5° and 90°.

9. A method according to claim 6, wherein said diamond crystal growing process is conducted by chemical vapor deposition.

10. A method according to claim 6, wherein said ultrasonic treatment is conducted in liquid dispersion of fine diamond particles.

11. A method for forming a Schottky diode, comprising the steps of:
    applying a diamond crystal growing process to a substrate on which nucleation sites are formed on at least one of an edge and a corner of a protruding portion provided at a desired position, so as to form a crystalline body on the edge or corner of the protruding portion;
    effecting monocrystalline diamond growth at the edge or corner of the protruding portion; and
    forming a Schottky electrode in contact with the body.

12. A method according to claim 11, wherein the height of said protruding portion is between 0.1 and 1 $\mu m$.

13. A method according to claim 11, wherein said diamond crystal growing process is conducted by chemical vapor deposition.

14. A method according to claim 11, wherein the formation of said nucleation sites is conducted by ion beam irradiation onto the substrate subjected to an ultrasonic treatment.

* * * * *